United States Patent [19]

Siwek

[11] 4,427,716

[45] Jan. 24, 1984

[54] METHOD FOR PREDETERMINING PEEL STRENGTH AT COPPER/ALUMINUM INTERFACE

[75] Inventor: Erwin G. Siwek, Saratoga Springs, N.Y.

[73] Assignee: General Electric Company, Schenectady, N.Y.

[21] Appl. No.: 459,748

[22] Filed: Jan. 21, 1983

[51] Int. Cl.³ ............................................. B05D 5/12
[52] U.S. Cl. ..................................... 427/99; 156/233; 156/231; 427/383.9; 427/250; 164/46
[58] Field of Search .................. 156/233, 231; 427/99, 427/383.9, 250; 164/46

[56] References Cited

U.S. PATENT DOCUMENTS 3,969,199  7/1976  Berdan et al. .......................... 204/33
3,984,598 10/1976  Sarazin et al. ........................ 428/336
4,357,395 11/1982  Lifshin ................................. 156/233

OTHER PUBLICATIONS

"Lattice and Grain Boundary Diffusion of Copper in Thin Aluminum Films" by Chamberlain, et al. [*Thin Solid Films*, 45 (1977), pp. 189–194].
"Effect of Surface Contamination on Solid Phase Welding—An Overview" by J. L. Jellison [*Surface Contamination* edited by K. L. Mittal, vol. 2, Plenum Press (1979)].

*Primary Examiner*—Sam Silverberg
*Attorney, Agent, or Firm*—Leo I. MaLossi; James C. Davis, Jr.; James Magee, Jr.

[57] ABSTRACT

A method is disclosed for predetermining the magnitude of the average release peel strength at the interface between a vapor deposited copper film and a flexible aluminum carrier sheet to which the copper has been previously directly applied. The resulting copper-to-aluminum adherence is due to the formation of a preferential diffusion bond.

9 Claims, 3 Drawing Figures

METHOD FOR PREDETERMINING PEEL STRENGTH AT COPPER/ALUMINUM INTERFACE

BACKGROUND OF THE INVENTION

The invention relates particularly to laminate precursors employed in the preparation of copper-clad assemblies having special utility in the production of high-resolution printed circuit boards and with a new method for making such laminate precursors.

This invention is related to the invention disclosed and claimed in copending U.S. patent application Ser. No. 227,290—Lifshin, et al., filed Jan. 22, 1981. The Lifshin, et al. application is directed to the method of depositing copper directly on a carrier surface by vapor deposition while controlling the adhesion between the copper and the carrier surface. This is accomplished by maintaining the carrier surface at a temperature in the range of from about 100° C. to about 250° C. with the result that the peel strength (i.e. the force required to separate these components) is to be between about 0.20 at 2.0 pounds/inch. Copper-clad assemblies utilizing the laminate precursors of this invention may advantageously prepared by the practice of the invention set forth in U.S. patent application Ser. No. 406,588—Green, et al., filed Aug. 9, 1982. According to the Green, et al. invention, a bonding system comprising a metal oxide layer and a coupling agent layer is used to interconnect the copper film of the laminate precursor to a resin-bonded, glass-reinforced substrate.

U.S. Pat. No. 3,969,199—Berdan, et al. is illustrative of the prior art patents utilizing an aluminum carrier sheet as a substrate for the deposition and handling of a copper layer. In Berdan, et al. the copper is deposited by electroplating and carrier sheet surface modification is relied upon to develop a desired peel strength.

It is a particularly important objective of this invention to be able to utilize commercially available aluminum foil as the carrier sheet in the preparation of the laminate precursor leading to the manufacture of copper-clad assemblies for ultimate usage in the preparation of printed circuit boards.

None of the commercially available foil strong enough to be used for this purpose is completely free of hydrocarbon contaminants. The contamination of aluminum foil begins during the rolling of aluminum billets to produce aluminum foil. The rolling is done in several passes each reducing the aluminum thickness by approximately 50 percent. Each such cold reduction pass is followed by a stress relief anneal to avoid tearing and pitting of the aluminum during the next reduction. Drawing lubricants are used during the cold reductions, the most popular being the combination of kerosene and mineral oil.

Fully soft aluminum foil is desired in many applications and in making foil for such applications the drawing lubricant can be burned off by heating to 300° C. or even higher. However, in the case of aluminum foil for use as a carrier sheet, retention of the mechanical properties is important. Foil thicknesses employed as carrier sheets are of the order of 0.002 inch thick and must be strong enough to be used in roll form in an unrolling and rerolling operation carried on with a fixed tension. In order to avoid tearing, when such carrier sheet material is separated from the completed copper-clad assembly, it is preferable that the yield strength of the aluminum carrier sheet not be less than about 10,000 psi. This latter, therefore, limits the techniques employable for driving off the surface-contaminating hydrocarbons.

Commercially available chemically cleaned aluminum foil (defined hereinafter) is particularly attractive for this use, since this commercially available material retains the full hardness of unannealed severely cold worked aluminum foil. The problem remains, however, that aluminum foil so cleaned still retains on its surfaces a minimum of 0.3 $\mu g/cm^2$ of hydrocarbon contaminants, which is enough to rule out van der Waals adsorption as a reliable adhesional force between vapor deposited copper and the aluminum carrier sheet on which it is deposited. It is, therefore, necessary to develop other adhesional forces in order to provide sufficient peel strength in order to have the aluminum foil/copper layer laminate remain intact until it is desired to remove the aluminum by peeling it away. By the practice of this invention it becomes practical to develop such adhesional forces using this commercially available aluminum foil "as received".

Another method by which a suitable peel strength can be produced is that described in the Lifshin, et al. application referred to hereinabove providing that the hydrocarbon contamination on the chemically clean aluminum sheet (about 0.3 to about 1.0 $\mu g/cm^2$) is at the low end of the range. However, even in the practice of the Lifshin, et al. invention it is to be expected that, if the surface hydrocarbon contamination of the aluminum sheet is in the high end of the range for chemically clean aluminum foil, the laminate precursor produced may not have the desired peel strength. In such instances this invention offers an alternate to discarding such sub-standard laminate precursor, because it now becomes possible to render to this material a predetermined magnitude peel strength such that the force required to peel the aluminum foil from the ultra-thin copper will not be so great as to tear the copper film from its anchorage in the substrate or tear the aluminum foil or be a force so small that the aluminum foil falls off the ultra-thin copper during handling.

DEFINITIONS

"Ultra-thin" designates thickness less than about 16 microns.

"Film" and "foil" mean, respectively, an ultra-thin coating and the combination of such coating and one or more ultra-thin coatings of another metal or other material.

"Vapor deposition" means and includes sputtering, physical evaporation (i.e. electron beam, inductive and/or resistive evaporation), chemical vapor deposition, and ion plating.

"Substrate", as that term is used in this specification and the appended claims, means and refers to that part of the copper-clad assembly (or other article of manufacture of this invention) which serves as the physical support means for the metal film or foil being suitably a glass-epoxy body provided in the form of a prepreg for cure in contact with the copper foil. Other materials useful for this purpose include, but are not limited to, that known in the trade as "phenolic paper resins" which are paper sheet products impregnated with a resin curable to provide an adhesive bond between the substrate and the metal foil of the laminate. Still other such materials are polyimides and polyester resins.

"Chemically clean" when applied to commercial aluminum foil indicates that the hydrocarbon contamination (e.g. due to the presence of drawing lubricants used during cold reduction passes in the preparation of aluminum foil from aluminum billets) has been substantially reduced by the use of chemical cleaning. Typically, such cleaning of aluminum foil begins with vapor degreasing in a solvent, such as trichloroethylene, followed by cleaning with an appropriate aqueous solution of an alkaline cleaner and, finally, a pressurized water rinse. Determinations of hydrocarbon contamination on chemically clean aluminum have established residual hydrocarbon contamination in the range of from about 0.3 to about 1.0 $\mu g/cm^2$ (micrograms per square centimeter).

"Protective atmosphere" means and includes the use during processing (e.g. in an oven) of vacuum, inert gas (such as helium, argon or nitrogen) or reducing gas (such as hydrogen). Preferably, the oxygen content of the protective atmosphere should be less than about 1 percent by volume. In the case of vacuum, a vacuum of less than about 2 inches of mercury at about 22° C. reduces oxygen concentration to a very low level.

"Peel strength" is indicated as being the measurement of force in pounds required to separate, for example, a 1-inch wide strip of the carrier sheet from the copper film (the copper film being anchored to the substrate) when pulled at an angle of 90°. Regardless of the actual lineal width of strip pulled during the test, this parameter is expressed in lbs/lineal inch.

DESCRIPTION OF THE INVENTION

According to this invention, after a vapor deposited copper film has been directly applied to commercial chemically clean aluminum sheet, if the adherence between the copper and the aluminum is less than about 0.2 pounds per inch, this laminate is subjected to heating in a protective atmosphere at a temperature in excess of about 150° C. for a preset time sufficient to develop a diffusion bond between the copper and the aluminum requiring an average force of between about 0.2 and 2.0 pounds per inch to peel the aluminum sheet from the copper surface. The maximum heating exposure (i.e. time and temperature) of the laminate, however, shall be such as not to reduce the yield strength of the aluminum sheet from a value substantially in excess of 10,000 psi to a value of less than about 10,000 psi. Thereafter, the laminate precursor is cooled, or permitted to cool, to ambient (i.e. room) temperature while still in a protective atmosphere. The oxygen content of the protective atmosphere should be less than about 1 percent by volume and useful protective atmospheres may be selected from the group consisting of vacuum, helium gas, argon gas, hydrogen gas and nitrogen gas.

For a particularly bright, cosmetically attractive copper surface, a vacuum of 2" of mercury or less, hydrogen gas or combined vacuum and hydrogen gas atmosphere is used.

MANNER AND PROCESS OF MAKING AND USING THE INVENTION

Figure 1:
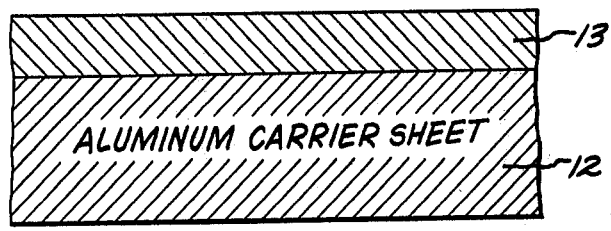
FIG. 1 is a schematic representation in cross-section of the laminate precursor of this invention.

Copper film 13 is formed directly on the surface of commercial chemically clean aluminum foil functioning as carrier sheet 12. Optimally, the conditions for the copper deposition [e.g. pressure and ambient, deposition temperature, deposition rate, deposition time, (i.e. web speed of the aluminum foil)] will be established such that layer 13 will be uniformly thick, continuous, smooth, and pinhole-free at about 100 percent of theoretical density with a columnar structure. The thickness of layer 13 should be ultra-thin or, if desired, may be thicker, e.g. up to 25 microns, and the average grain size of the copper should be of the order of from a few hundred Angstroms to about one micron.

There is, of course, no certainty that even with the establishment of proper vapor deposition parameters that the bond between the copper film and the aluminum carrier sheet will have the proper peel strength, because of such aspects as the variability of surface contamination on the aluminum foil as received.

During the vapor deposition, atomic copper in the gas phase impinges on the aluminum substrate but remains mobile until it has lost sufficient energy and attaches itself to a clean spot on the aluminum. If a clean spot is not available and sufficient energy is lost the copper will attach itself to a contaminant atom. In moving about the aluminum each copper atom gives up thermal energy at a rate dependent on the temperature difference between the gaseous atomic copper and the aluminum substrate, the hotter the aluminum substrate the longer the copper can remain mobile on the aluminum substrate and the better its possibility for adhering to a clean spot on the aluminum. Preferentially, the gaseous copper attaches itself to a copper atom which has previously attached itself to the aluminum. The second preference for the copper is a clean spot on the aluminum. For these reasons copper is not deposited in a uniform film but in aggregates, or islands, of molecules. Eventually the islands of copper join to form a continuous copper film. If the aluminum has only a few clean spots per unit area, those spots will be the primary nucleation sites of copper to aluminum and the copper will be bound to the aluminum only through these few primary nucleation sites plus some secondary nucleation sites. The preferred adhesion of copper to aluminum results from many small nucleation sites rather than a few large nucleation sites. Clean aluminum favors the formation of many nucleation sites since the atomic copper has more aluminum area available for nucleation. The atomic copper is then less likely to attach itself to a previously deposited copper atom or to an unclean area on the aluminum foil. A heated aluminum substrate also favors many nucleation sites since it allows the gaseous atomic copper more mobility hence more time in which to attach itself to clean aluminum. The poorest adhesion results from the deposition of copper on an unclean aluminum surface.

Given a chemically clean aluminum foil having an average hydrocarbon contamination on its surface closer to the low end of the range encountered in commercial chemically cleaned aluminum foil (i.e. about 0.3 $\mu g/cm^2$) and utilizing the invention described in the aforementioned Lifshin, et al. application (in accordance with which the carrier sheet 12 is maintained at a temperature in the range of from about 100° C. to 250° C. during the deposition process, which is conducted under vacuum) it can be expected that copper film 13 formed directly on such sheet by vapor deposition, will adhere to the carrier sheet 12 such that the peel strength for separating these layers would lie between about 0.2 and 2.0 lbs/in. and, preferably, in the range of from about 0.4 to 1.0 lbs/in. However, because of the variability one may encounter from roll to roll of commercial chemically clean aluminum foil, it can be expected that at least periodically inadequate peel strengths (e.g. less than 0.1 lbs/in.) on the average will be encountered.

Thus, whether the Lifshin, et al. invention is utilized and copper/aluminum carrier laminate material is produced at random having inadequate peel strength or whether copper film is vapor deposited upon aluminum foil without heating the foil to a temperature in the 100°–250° C. range of the Lifshin, et al. invention, according to the practice of this invention the laminate so produced is heated in a protective atmosphere at a temperature in excess of about 150° C. for a time sufficient to develop a diffusion bond between the copper film and the aluminum sheet requiring a force of between 0.2 and 2.0 lbs/in. to peel the aluminum from the copper film. The maximum heating exposure to which the laminate is subjected should be such as will not reduce the yield strength of the aluminum sheet from its original value of substantially greater than 10,000 psi to a yield strength below about 10,000 psi. The maximum heating exposure to which a given aluminum carrier sheet composition can be subjected is routinely determinable, since this would be a characteristic of the carrier sheet composition.

After the heating step has been conducted, the laminate should be cooled, or be permitted to cool, to ambient temperature in the same or another protective atmosphere. Manifestly, the heating of the laminate of inadequate peel strength may be carried out either by unrolling and rerolling the laminate so that a suitable length of aluminum sheet receives the primary heating exposure, or the roll of such laminate may be heat-soaked at the proper temperature for the requisite time such as will develop the desired peel strength.

Suitable protective atmospheres for the practice of this invention can be provided by the use of vacuum or by a gaseous environment selected, for example, from the group consisting of helium, argon, hydrogen and nitrogen. The concentration of oxygen in the protective atmosphere should be less than 1 percent by volume and preferably much less. The very low oxygen concentration in the protective environment is of particular necessity when the invention described and claimed in the Green, et al. application (referred to hereinabove) is employed to provide the requisite bonding system for affixing the laminate precursor to the substrate in preparing the copper-clad assembly.

Figure 2:
FIG. 2 is a view similar to FIG. 1 representing the assembly immediately prior to completion of the copper-clad assembly shown in FIG. 3, when utilizing the bonding system disclosed and claimed in the Green, et al. application referred to hereinabove.

Thus, if the copper film is deposited on the chemically clean aluminum foil and a subsequent thin layer of metal oxide (shown as layer 14 in FIG. 2, for example, a zinc oxide layer) is applied to the surface of the copper film prior to the conduct of the heating step of this invention, black spots may appear on the copper. Although such spots do not interfere with the utilitarian aspects of the copper film (as in a printed circuit board application), there is a reduction in the value of the product from an appearance point of view. The occurrence of such black spots can be avoided when the metal oxide layer is present, by utilizing a reducing atmosphere (e.g. hydrogen) or by utilizing a vacuum equal to or less than 2 inches of mercury at 22°. Care must be taken not to reduce non-copper oxides present.

The heating step of this invention is utilized to provide a preferred diffusion bond between the copper film and the aluminum carrier sheet. Unlike van der Waals adsorption, which represents relatively weak adhesional forces between vapor deposited copper and aluminum foil, this diffusion bonding provides a chemical, or primary, bond. Academic studies of the diffusion phenomenon are, manifestly, carried out with scrupulously clean interfaces between the metals being studied. Thus, studies of the diffusivity of copper in aluminum thin films such as is described in "Lattice and Grain Boundary Diffusion of Copper In Thin Aluminum Films" by Chamberlain, et al. [*Thin Solid Films, 45* (1977), pp. 189–194] provide insufficient guidance to the diffusivity of copper into aluminum when the aluminum surface is contaminated with hydrocarbon residue. At least one study has been made on the role of contaminants in preventing solid phase welds, "Effect of Surface Contamination On Solid Phase Welding—An Overview" by J. L. Jellison [*Surface Contamination* edited by K. L. Mittal, volume 2, Plenum Press (1979)]. It is reported therein (page 908) that observations have been made establishing that the coefficient of adhesion between metals is inversely proportional to the length of the hydrocarbon chain and is very sensitive to the thickness of the contaminant hydrocarbon layer, thus establishing that adhesion between metal surfaces is strongly affected by the presence of hydrocarbon contaminants therebetween.

The results of tests performed to determine the effect of heat treatment on the extent of diffusion bonding occurring between a vapor deposited film of copper and a carrier sheet of commercial chemically clean aluminum foil are reported in Table I. The temperature of the heat treatment was varied, and likewise the time of heating was varied at most of the treatment temperatures. Each test sample was 1 inch wide and 12 inches long. The peel strength was determined after heat treatment by pulling the aluminum foil away from the copper (which was bonded to a glass-reinforced epoxy substrate) across its 1 inch dimension. Instantaneous values of peel strength were recorded as the full 12 inches of aluminum foil was removed. The peel strength recorded in Table I for each sample is an average value for the 12 inch length. The various samples from which these data were obtained had initial peel strengths of less than 0.1 lbs/in. before the elevated temperature treatment. The variability of the data reflecting carrier peel with some values clearly being aberrations is probably due to the variability of the contaminant levels on the various aluminum foil samples, the peel strengths representing the number of adhesion/diffusion sites per unit area. As may be seen in Table I, the preferred temperature range begins at about 200° C.

TABLE I

| Temp. (°C.) | Time (Hrs) | Carrier Peel (lb/in) |
|---|---|---|
| 150 | 9 | .1 |
| 150 | 9 | .1 |
| 200 | .5 | .70 |
| 200 | 1 | 2.68 |
| 200 | 1 | .1 |
| 200 | 1 | .1 |
| 200 | 4 | .2 |
| 200 | 4 | .34 |
| 200 | 6 | .1 |
| 200 | 6 | .91 |
| 200 | 6 | .14 |

TABLE I-continued

| Temp. (°C.) | Time (Hrs) | Carrier Peel (lb/in) |
| --- | --- | --- |
| 200 | 15 | 1.82 |
| 200 | 20 | .34 |
| 250 | 6 | 1.66 |
| 300 | .5 | .26 |
| 300 | 1 | 3.85 |
| 300 | 1 | .60 |
| 300 | 1 | 2.14 |
| 300 | 2 | .55 |
| 300 | 2 | 1.14 |
| 300 | 3.5 | .39 |
| 300 | 4 | .77 |
| 300 | 4 | 1.68 |
| 300 | 4 | 1.77 |
| 300 | 4 | .77 |

In the practice of the invention described and claimed in the Green, et al. application referred to hereinabove, copper film 13 having been deposited, preferably in the thickness of from 1 to 16 microns (although thicker layers can be used), copper film 13 is then coated with layer 14 (i.e. a metal oxide layer or a mixture of metal oxides) by vapor deposition (usually in the same deposition chamber) in a relatively uniform thickness ranging from about 10 to 500 Angstroms (preferably in the range of 10–100 Angstroms) under vacuum with controlled oxygen and water vapor content as monitored by a residual gas analyzer. As described hereinabove, if the laminate precursor of FIG. 1 has not already been subjected to the heating step of this invention in order to secure a predetermined peel strength, the structure defined to this point may be subjected to such heating step without reducing oxide layer 14.

Figure 3:
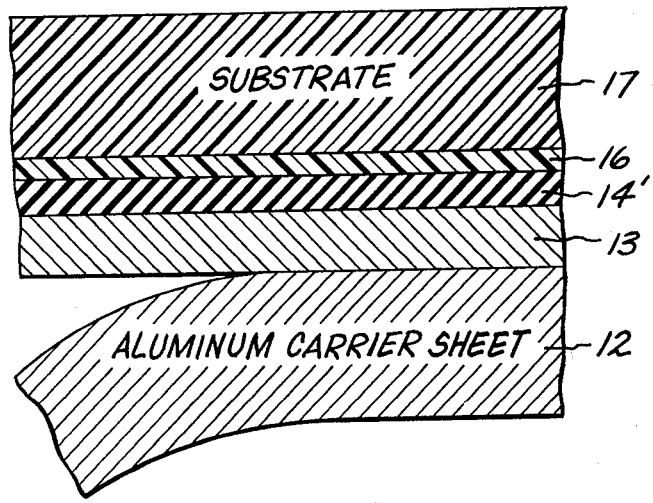
FIG. 3 is a schematic cross-sectional view of the copper-clad assembly from which the aluminum carrier sheet is partially removed.

The oxide layer so deposited receives thereafter layer 16 of a solution of coupling agent. The coupling agent preferably comprises an organosilane. When the coupling agent material has dried, the assembly of carrier sheet 12, copper film 13, oxide layer 14 and coupling agent layer 16 is bonded to the glass reinforced epoxy board 17 (shown in FIG. 3) using a temperature of about 175° C. simultaneously with the application of pressure of about 150 psi for a time of about 30 to about 40 minutes at temperature. At this point, a copper-clad assembly comprising components 13, 14', 16 and 17 will have been prepared and, when use is to be made of this assembly, aluminum carrier sheet 12 is stripped therefrom to expose layer 13.

In the case of assemblies of smaller area ranging up to about 12 inches by 12 inches, stripping of the carrier sheet 12 from the assembly may be accomplished readily in a hand operation, however, it may be more convenient to utilize a mechanical device for this purpose. In the case of very large area assemblies, it would be preferred to employ mechanical assist in order to apply a more steady, evenly-distributed force to the carrier sheet.

Although this invention has been described utilizing the laminate precursor of FIG. 1 in conjunction with one particular mode of bonding to a substrate to produce the copper-clad assembly, any prior art means of achieving the requisite bonding may be employed without affecting the efficacy of this invention.

What I claim as new and desire to secure by Letters Patent of the United States is:

1. A method for developing a bond between contiguous metallic laminae having a predetermined average unit magnitude, said method comprising the steps of:
   (a) forming a copper film on a flexible aluminum carrier sheet to produce a laminate by applying copper directly on a major surface of said aluminum sheet by vapor deposition with the crystals of said copper film being predominately columnar in configuration, the yield strength of said aluminum sheet being significantly in excess of 10,000 psi and said surface being free from hydrocarbon contamination to an extent at least comparable to being in "chemically clean" condition at the time of such vapor deposition;
   (b) heating said laminate in a protective atmosphere at a temperature in excess of about 150° C. for a preset time sufficient to develop a diffusion bond between said copper film and said aluminum sheet requiring a force of between about 0.2 and 2.0 pounds per lineal inch to peel said aluminum sheet from said copper film, the maximum heating exposure being such as not to reduce the yield strength of said aluminum sheet below about 10,000 psi and
   (c) cooling said laminate to room temperature in a protective atmosphere.

2. The method of claim 1 wherein the protective atmosphere used is selected from the group consisting of vacuum, helium gas, argon gas, hydrogen gas and nitrogen gas.

3. The method of claim 2 wherein an oxygen content of less than 1 percent by volume prevails in the protective atmosphere employed.

4. The method of claim 1 wherein the peel strength of the laminate is between about 0.4 and 1.0 pounds per lineal inch.

5. The method of claim 1 including, after the step of forming the copper film on the aluminum sheet, the step of depositing a layer of an oxide of a second metal over said copper film under conditions of temperature and pressure substantially precluding the formation of copper oxide.

6. The method of claim 5 wherein the heating is conducted in a protective atmosphere selected from the group consisting of (a) vacuum of less than about 2 inches of mercury and (b) reducing gas.

7. The method of claim 6 wherein the protective atmosphere is hydrogen.

8. The method of claim 1 wherein the temperature during the heating step is in the range of 200° to 300° C.

9. The method of claim 1 wherein the heating and cooling steps are conducted in the same protective atmosphere.

* * * * *